(12) United States Patent
Bratkovski et al.

(10) Patent No.: US 7,989,841 B1
(45) Date of Patent: Aug. 2, 2011

(54) FAST INJECTION OPTICAL SWITCH

(75) Inventors: Alexandre M. Bratkovski, Mountain View, CA (US); Shih-Yuan Wang, Palo Alto, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 687 days.

(21) Appl. No.: 11/831,704

(22) Filed: Jul. 31, 2007

(51) Int. Cl.
*H01S 5/00* (2006.01)

(52) U.S. Cl. ........ 257/107; 257/109; 257/115; 257/155; 257/156; 257/E31.071; 257/E29.337

(58) Field of Classification Search .................. 257/107, 257/113, 115
See application file for complete search history.

(56) References Cited

U.S. PATENT DOCUMENTS

| | | | |
|---|---|---|---|
| 4,152,713 A | 5/1979 | Copeland, III et al. | |
| 4,806,997 A | 2/1989 | Simmons et al. | |
| 4,864,168 A | 9/1989 | Kasahara et al. | |
| 4,910,571 A | 3/1990 | Kasahara et al. | |
| 5,136,353 A | 8/1992 | Pankove et al. | |
| 5,432,722 A | 7/1995 | Guilfoyle et al. | |
| 5,652,439 A * | 7/1997 | Kuijk et al. | 257/113 |
| 5,666,376 A | 9/1997 | Cheng | |
| 5,677,552 A * | 10/1997 | Ogura | 257/113 |
| 5,751,466 A * | 5/1998 | Dowling et al. | 359/248 |
| 5,847,415 A | 12/1998 | Sakata | |
| 5,913,107 A | 6/1999 | Sakata | |
| 6,633,692 B2 * | 10/2003 | Chua et al. | 385/16 |
| 6,717,182 B1 * | 4/2004 | Tagami et al. | 257/83 |
| 6,885,779 B2 * | 4/2005 | Keys et al. | 385/2 |
| 6,891,986 B2 | 5/2005 | Iio et al. | |
| 7,126,168 B1 * | 10/2006 | Vashchenko et al. | 257/155 |
| 7,200,290 B2 | 4/2007 | Morio et al. | |
| 2004/0081216 A1 * | 4/2004 | Dehmubed et al. | 372/50 |
| 2005/0041903 A1 | 2/2005 | Iio et al. | |
| 2005/0230705 A1 * | 10/2005 | Taylor | 257/120 |
| 2005/0271324 A1 | 12/2005 | Nielson et al. | |
| 2006/0023997 A1 | 2/2006 | Almeida et al. | |
| 2006/0051010 A1 | 3/2006 | Chu et al. | |
| 2006/0138607 A1 * | 6/2006 | Nemoto | 257/656 |
| 2006/0261348 A1 * | 11/2006 | Ryu et al. | 257/77 |

* cited by examiner

*Primary Examiner* — Leonardo Andújar
*Assistant Examiner* — William Harriston

(57) ABSTRACT

A fast injection optical switch is disclosed. The optical switch includes a thyristor having a plurality of layers including an outer doped layer and a switching layer. An area of the thyristor is configured to receive a light beam to be directed through at least one of the plurality of layers and exit the thyristor at a predetermined angle. At least two electrodes are coupled to the thyristor and configured to enable a voltage to be applied to facilitate carriers from the outer doped layer to be directed to the switching layer. Sufficient carriers can be directed to the switching layer to provide a change in refractive index of the switching layer to redirect at least a portion of the light beam to exit the thyristor at a deflection angle different from the predetermined angle.

18 Claims, 4 Drawing Sheets

FAST INJECTION OPTICAL SWITCH

BACKGROUND

As computing power and data storage have exponentially increased over the last several decades, a corresponding amount of stored data has also exponentially increased. Computers which were once the domain of text files and a few low resolution pictures are now often used to store thousands of high resolution pictures and hours of video. Television sets are being upgraded to show high definition video. New generations of optical discs have been developed to hold the high definition video. The discs can hold as much as 50 gigabytes of data on each side, enough to store several hours of video in a high definition format. Ever larger storage formats are being developed to store the increasing amounts of information.

Moving and transmitting the vast amounts of digital information is becoming more challenging. Each year, more electronic devices are available that can digitally communicate with other devices. Electronics including computers, high definition television, high definition radio, digital music players, portable computers, and many other types of devices have been designed to transmit and receive large amounts of information. Many computers now receive broadband internet which is broadcast throughout the home. Televisions are receiving multiple high definition signals from cable and fiber optics.

In order to transmit the immense quantities of data stored in computers and broadcast to televisions and other electronics devices, the data is transmitted at ever faster rates. However, transmission rates are not keeping up with the explosion in data. For example, to transmit a typical 15 gigabyte high definition movie from an optical disk to a home entertainment system, it requires 100 megabits to be transmitted per second for twenty minutes. For many users, taking 20 minutes to transfer a movie can be burdensome.

One way to decrease the amount of time it takes to move large amounts of digital information is to transmit the information at faster speeds. Transmission speeds that can move large volumes of data in a reasonable time, however, have historically been too costly to be broadly used in consumer electronics.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Transmitting data at higher data rates can be accomplished by switching or modulating the data to encode information at higher speeds. Limiting factors can include the switching speed and the bandwidth of the medium over which the data will be transmitted. For example, electromagnetic radiation at optical frequencies can transmit data at relatively large bandwidths, such as tens of gigabits per second. Historically, modulating and/or switching data at tens of gigabits per second can require the use of exotic materials such as compound semiconductors (e.g., gallium arsenide and indium phosphide) that can be relatively expensive. The expense of the materials and difficulty in manufacturing has limited the use of high speed data transmission to a narrow niche of products and services. In accordance with one aspect of the invention, it has been recognized that a system and method is needed to inexpensively modulate and/or switch data at data rates sufficient to transfer large data files within a reasonable amount of time.

Figure 1:
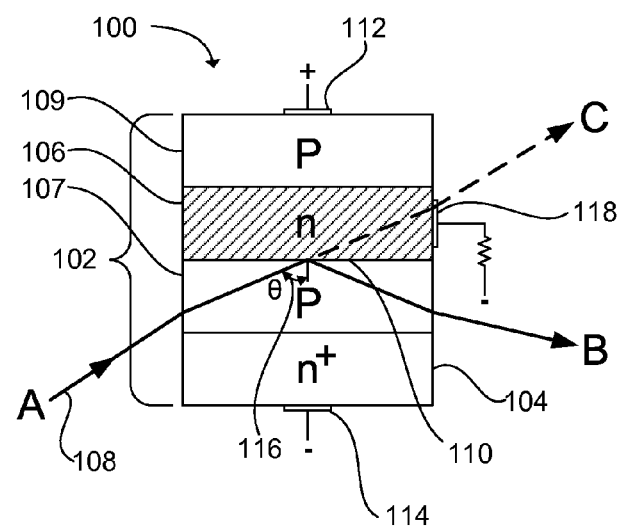
FIG. 1 is an illustration of a thyristor having an outer doped layer and a switching layer in accordance with an embodiment of the present invention.

A thyristor 100 having a plurality of semiconducting layers 102 is illustrated in FIG. 1. A thyristor is a solid-state semiconductor device with at least four layers of alternating conductivity types. The conductivity types are typically referred to as negative (N-type) and positive (P-type). A thyristor is typically used in applications that take advantage of the thyristor's highly non-linear current-voltage (IV) characteristic, such as applications where high currents and high voltages are involved.

The thyristor 100 can be constructed using semiconductor materials that are substantially transparent at the wavelength of the light beam 108. For example, the layers 102 can be constructed using silicon. The use of silicon to form the thyristor can be advantageous since it is relatively inexpensive, easy to manufacture, and can be substantially transparent at selected wavelengths. However, the thyristor can also be formed of other types of semiconductors such as indium phosphide (InP), indium aluminum arsenide (InAlAs), gallium arsenide (GaAs), indium gallium arsenide (InGaAs), and other III-V type semiconductors. Each of the layers 102 in the thyristor can be doped or made of a material selected to have a predetermined conductivity or index of refraction.

The refractive index or index of refraction of a medium is the inverse ratio of the phase velocity of a wave, such as light, and the phase velocity in a reference medium. For light, the index of refraction, typically given the symbol n, is equal to:

$$n = \sqrt{\epsilon_r \mu_r}$$

where $\epsilon_r$ is the material's relative permittivity and $\mu_r$ is the material's relative permeability. For free space, the value of n is 1.0. For most types of materials, the value of n is greater than one.

When light crosses a boundary between materials with different refractive indices, the light beam will be partially refracted at the boundary surface, and partially reflected. The angle of incidence where light is refracted so that it travels along the boundary is referred to as the critical angle $\theta_c$. If the angle of incidence $\theta$ is greater (i.e.: the ray is closer to being parallel to the boundary) than the critical angle then the light will stop crossing the boundary altogether and instead totally reflect back internally. This occurs where light travels from a medium with a higher refractive index to one with a lower refractive index. For example, it will occur when passing from glass to air, but not when passing from air to glass.

In one embodiment of the present invention, the index of refraction of the layers 102 in the thyristor 100 can be selected to allow the light beam 108 to pass through the thyristor from point A to point C, as shown in FIG. 1. The angle of incidence θ and the refractive indices of the switching layer, the adjacent layer, and possibly other layers are selected such that θ is less than the critical angle, which depends on the refractive indices of the layers. More specifically, the switching layer 106 can have an index of refraction that is greater than the index of refraction of the adjacent layer 107. The doping concentration in the switching layer may be selected to enable the desired index of refraction. Alternatively, the switching layer and other layers in the thyristor can be constructed of types of material(s) selected to provide the desired index of refraction in each layer. For example, a material such as SiGe or some other material with a desired refractive index may be used. Additional control may be obtained by adjusting the angle of incidence; for example, a prism may be used to enable the light beam to be inserted at a normal angle to the prism side wall.

Designing the switching layer to have an index of refraction greater than the refractive index of the adjacent layer allows the light to travel from point A through a medium with a lower refractive index (adjacent layer 107) and possibly other layers to a medium with a higher refractive index (the switching layer 106). Since the switching layer has a greater index of refraction than the adjacent layer, the light beam can pass through the boundary 110 between the layers and exit the thyristor at point C.

In one embodiment of the present invention, carriers can be injected at a relatively high speed into the switching layer 106 in the thyristor 100. The speed of the carrier injection is due to the regenerative feedback caused by the multiple layers present in the thyristor. One of the layers, referred to as the outer doped layer 104 and shown as N-type in FIG. 1, can be heavily doped. The outer doped layer may be formed at either the top or the bottom of the thyristor. The switching layer can be formed of the same conductivity type as the layer that is shown as the outer doped in this example. The switching layer can be lightly doped relative to the outer doped layer, which can be relatively heavily doped. Alternatively, the outer doped layer may be a doped layer, with a heavily doped area in contact with an electrode.

In the example embodiment shown in FIG. 1, a positive bias can be applied through an anode electrode 112 coupled to the top, P-type layer 109 relative to the cathode electrode 114 coupled to the outer doped layer 104. The positive bias can quickly inject carriers from the outer doped layer 104 into the switching layer 106. Surrounding the switching layer by material with a different conductivity type, such as P-type material in this example, allows a large number of carriers to be injected from the outer doped layer into the switching layer.

More specifically, the applied bias is initially dropped mainly on the second p-n junction, and then either (i) regenerative positive feedback increases the carrier density in the switching layer or (ii) avalanche multiplication develops in the $2^{nd}$ depleted area or (iii) the depletion reaches through the adjacent layer (punchthrough), effectively shorting the switching layer to the first region 104, which is of the same conductivity type and is connected to an electrode. The resulting high carrier injection increases the carrier density in the switching layer, allowing the thyristor to be used as a fast injection optical switch.

Figure 2:
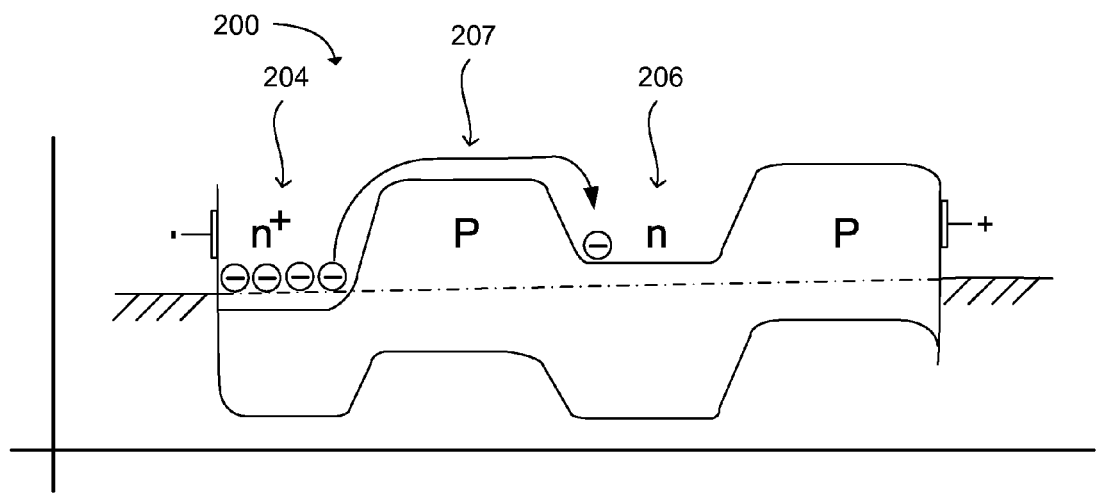
FIG. 2 is an illustration of an energy band diagram of the thyristor in accordance with an embodiment of the present invention.

FIG. 2 illustrates the PNPN junction of the thyristor 100 in an energy band diagram 200. It can be seen, in this example, that applying a forward bias to the outermost PN junctions in the thyristor, as illustrated in FIG. 1, can lower the barrier to carrier injection created at the P-N junction between 204 and 207 and allow the carriers, in this case electrons, to rapidly flow from the outer doped layer 204 to the switching layer 206. Alternatively, an NPNP type thyristor can be used. In the alternative case, as can be appreciated, the NP junctions can be forward biased with the N-type region negative compared to the P-type region, allowing holes to flow from a heavily doped P-type layer to a more lightly doped P-type (switching) layer that is separated from the more heavily doped outer doped layer by an N-type layer.

Returning to FIG. 1, the index of refraction of the switching layer can be altered as the conductivity of the switching layer 106 in the thyristor 100 is changed by injecting carriers from the outer doped layer 104 into the switching layer. In the example shown in FIG. 1, the index of refraction of the switching layer can be decreased to a point that it will become lower than the index of refraction of the adjacent layer 107. The angle 116 at which the light beam 108 hits the boundary 110 between the switching layer and the adjacent layer can be selected to be greater than the critical angle corresponding to the index of refraction of the adjacent layer 107 and the reduced index of refraction of the switching layer 106.

When carriers are injected into the switching layer, the change in the index of refraction can cause the light beam 108 to be reflected at an angle equal to the angle of incidence θ and redirected to exit the thyristor at point B. As previously discussed, the multiple layers present in the thyristor enable the carriers to be injected into the switching layer 106 by regenerative carrier injection, avalanching, or punch-through in a relatively short time period. This can allow the beam to be quickly redirected or switched from point C to point B.

Alternatively, the thyristor 100 can be used to modulate the light beam 108. The term modulation, as used in the present application, is considered to be a sub-set of switching, wherein modulation occurs when all or a portion of a light beam is switched from one output to a second output for a predetermined period of time. For example, amplitude modulation can be accomplished by redirecting a certain percentage of the light beam from point A to point C. The percentage that is redirected depends upon the relative indices of refraction of the switching layer and the adjacent layer and is described as the depth of modulation.

Alternatively, another type of modulation of the light beam that can be accomplished is pulse-width modulation. Pulse-width modulation can be accomplished by directing the light beam, from point A to point C for a period that will be referred to as off, followed by directing the light beam or a portion of the light beam from point A to point B, a period that will be referred to as on. The effect of the pulse width modulation is dependent on the ratio of on to off time.

Figure 4:
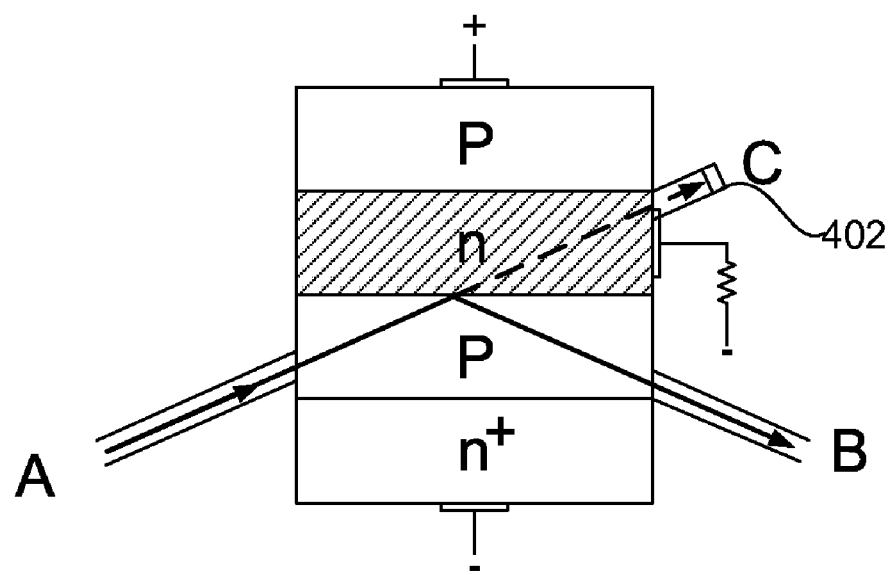
FIG. 4 is an illustration of a thyristor coupled to a waveguide having a light dump in accordance with an embodiment of the present invention.

A light dump 402 may be located at point C to absorb the light beam, as shown in FIG. 4. This may be useful when the thyristor is only used to modulate data onto the light beam that will exit at point B. Alternatively, as can be appreciated, the light dump may be located at point B and the modulated light beam may exit at point C.

In the example of FIG. 1, the carriers can be injected into the switching layer 106 of the thyristor 100 at a sufficient speed to modulate data at a rate of tens of gigahertz. The thyristor can be turned on, redirecting the light beam from point A to point B, by applying a positive bias to the anode 112. When the positive bias is turned off, the carriers can recombine within the switching layer to turn the thyristor "off" and allow the light beam to travel from point A to point C. However, the recombination rate of the carriers may be several orders of magnitude slower than the rate at which the carriers can be injected into the switching layer. Therefore, an extraction electrode 118 can be coupled to the switching layer to enable the excess carriers to be more quickly extracted when the positive bias is removed. The extraction electrode may be coupled to ground, as shown in FIG. 1. Alternatively, the extraction electrode can be biased at a voltage that will allow the excess carriers to be removed from the switching layer in a sufficient time for the desired switching or modulation rate. The extraction electrode may also be biased to enable carriers to be injected into the switching layer.

In one example embodiment, the thyristor 100 can be used to modulate the optical light beam 108 at a rate of 10 GHz. At this rate, the thyristor can be turned on in approximately 20 to 50 picoseconds (ps) to redirect a greater portion of the light beam, enabling a digital high to be formed. The thyristor can then be turned off in approximately the same time, causing less light to be redirected to form a digital low. In actuality, the thyristor can be turned on several times faster than it can be turned off. However, the amplitude modulation scheme may be used to form substantially symmetrical bits in the optical beam, requiring a relatively similar turn on time and turn off time. It should be noted that the thyristor is not limited to modulation or switching rates of 10 GHz. Several tens of gigahertz may be accomplished by injecting carriers from the outer doped layer 104 to the switching layer 106.

Figure 3:
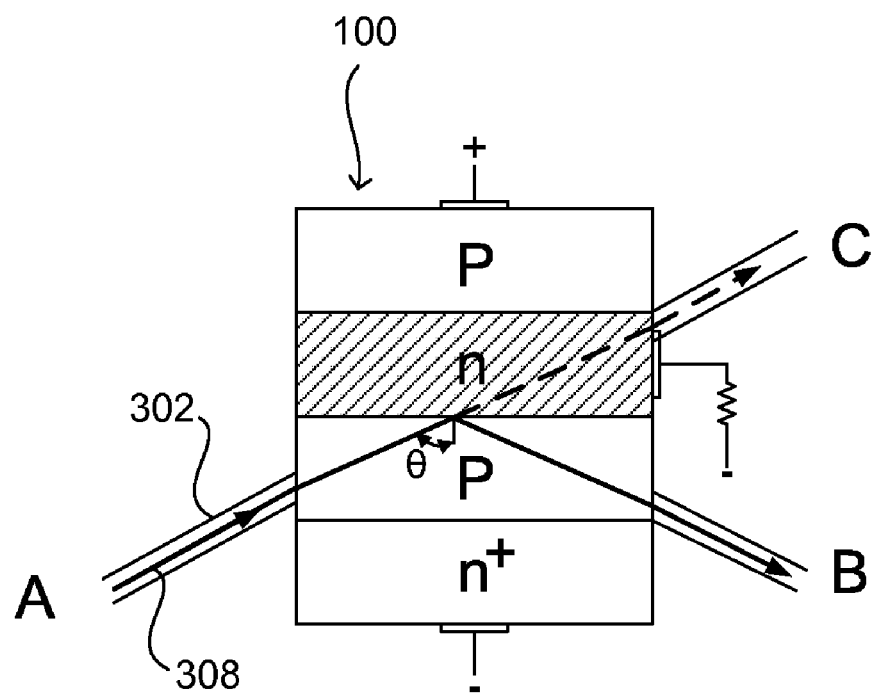
FIG. 3 is an illustration of a thyristor coupled to a waveguide in accordance with an embodiment of the present invention.

The thyristor can be integrated into a waveguide 302, as shown in FIG. 3. The waveguide can be constructed of materials that are substantially transparent to the light beam 316, such as silicon, silicon dioxide, or a polymer material. In one embodiment, the waveguide can be constructed of the same material as the thyristor. For example, both the waveguide and the thyristor can be constructed using silicon. Constructing the waveguide and the thyristor out of the same material(s) can reduce the complexity of the device by enabling the light beam to travel through the waveguide and thyristor without significant optical loss or other aberrations due to a change in the index of refraction between the waveguide and thyristor materials.

The waveguide 302 may also be constructed of a different material than the thyristor and configured to have a substantially similar index of refraction as the layer of the thyristor to which it is connected. For example, the waveguide may be a polymer holey waveguide with an inner core having a plurality of cavities, wherein the cavities have an average dimension that is substantially less than a wavelength of the light beam. The index of refraction of the inner core of the waveguide can be adjusted based on the number of cavities in the inner core. Alternatively, the index of refraction of the waveguide may be altered by doping the waveguide material.

In another embodiment, the waveguide and the thyristor may be made of different materials or have a different index of refraction. In this case, the waveguide can be aligned to account for beam displacement when it travels from the waveguide to the thyristor and vice versa due to a change in the index of refraction between the waveguide and the thyristor. Other methods or combinations of the embodiments discussed above may also be used to tune the waveguide's index of refraction, as can be appreciated by those skilled in the art.

Figure 5:
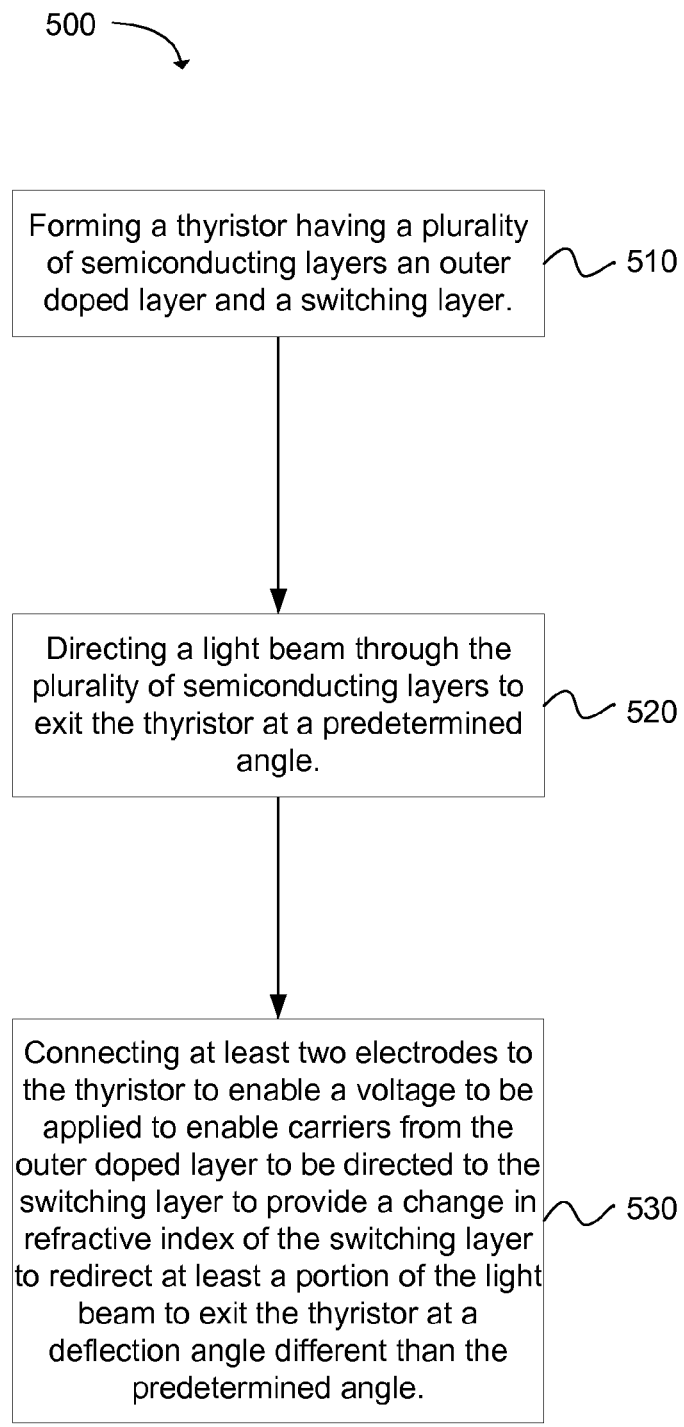
FIG. 5 is a flow chart depicting a method of making an optical switch in accordance with an embodiment of the present invention.

In another embodiment, a method 500 of making an optical switch for redirecting an optical beam is disclosed, as depicted in the flow chart in FIG. 5. The method includes the operation of forming 510 a thyristor having a plurality of semiconducting layers including semiconducting layers with alternating positive and negative conductivity types, wherein the plurality of semiconducting layers includes an outer doped layer and a switching layer. The switching layer can be of the same conductivity type as the outer doped layer. In one embodiment, the switching layer can be formed of silicon doped to have a carrier concentration of about $10^{14}$-$10^{15}$ carriers per cubic centimeter. The outer doped layer can include a heavily doped portion in contact with an electrode.

An additional operation of the method 500 includes configuring 520 an area of the thyristor to receive a light beam to be directed through at least one of the plurality of semiconducting layers and exit the thyristor at a predetermined angle. A further operation involves connecting 530 at least two electrodes to the thyristor to enable a voltage to be applied to facilitate carriers from the outer doped layer to be directed to the switching layer, wherein sufficient carriers are directed to the switching layer to provide a change in refractive index of the switching layer to redirect at least a portion of the light beam to exit the thyristor at a deflection angle different than the predetermined angle.

As previously discussed, the light beam can be directed to the switching layer that forms a PN junction. The change in carrier concentration of the switching layer can cause a change in the refractive index of the switching layer and result in the light beam being reflected. The light beam can be directed at the junction at an angle greater than the critical angle, resulting in a substantially total internal reflection when the carrier concentration in the switching layer is greater than a predetermined amount. The amount of carrier concentration necessary to provide total internal reflection is dependent on the wavelength of the light beam. For example, in silicon a carrier concentration of around $10^{18}$ to $5 \times 10^{21}$ carriers per cubic centimeter is typically sufficient to cause the light beam to be reflected, depending on the wavelength of the light beam. The light beam will be reflected from the PN junction at a deflection angle. The deflection angle, as used herein, is the angle of reflection, which is substantially equal to the angle of incidence with respect to a normal of the PN junction between the switching layer and the adjacent layer in the thyristor.

Figure 6:
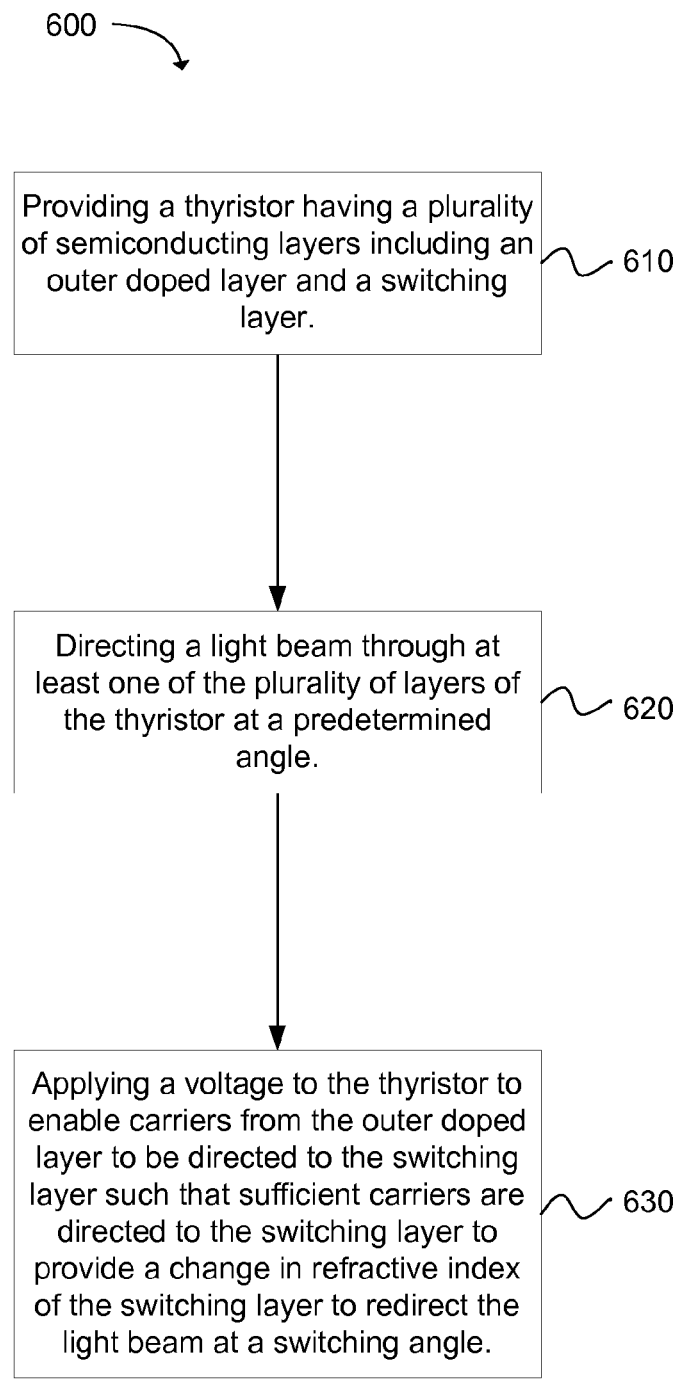
FIG. 6 is a flow chart depicting a method for redirecting an optical beam in accordance with an embodiment of the present invention.

Another embodiment of the invention provides a method 600 for redirecting an optical beam, as illustrated in the flow chart of FIG. 6. The method includes the operation of providing 610 a thyristor having a plurality of semiconducting layers including alternating positive and negative conductivity types, wherein the plurality of semiconducting layers includes an outer doped layer and a switching layer.

A further operation involves directing 620 a light beam through the thyristor at a predetermined angle, wherein the light beam passes through at least one of the plurality of semiconducting layers and exits the thyristor at a predetermined angle. The light beam may be directed to the thyristor without the assistance of another device. Alternatively, an input optical waveguide may be coupled to the thyristor and used to direct the light beam to the thyristor at a selected predetermined angle.

The method 600 includes the additional operation of redirecting 630 at least a portion of the light beam to exit the thyristor at a deflection angle different from the predetermined angle by applying a voltage to the thyristor to enable carriers from the outer doped layer to be directed to the switching layer such that sufficient carriers are directed to the switching layer to provide a change in refractive index of the switching layer to redirect at least a portion of the light beam.

The light beam may be redirected from a first output optical waveguide to a second output optical waveguide. The light beam may be partially or fully redirected, based on a number of carriers that are directed from the outer doped layer to the switching layer. The light beam may be switched or modulated by redirecting the light beam repeatedly between the different optical paths based on the carrier concentration in the switching layer. An extraction electrode may be coupled to the switching layer to facilitate excess carriers to be removed from the switching layer, enabling the carriers to be rapidly injected into and removed from the switching layer, depending on how the thyristor is biased.

Modulating or switching the light beam can be accomplished by varying the voltage applied to the thyristor at a relatively high frequency. For example, as previously discussed, the thyristor can be turned on and off, causing the light beam to be redirected, at a frequency of tens of gigahertz. The thyristor may be turned on and off in a selected pattern used to encode information. For example, binary information can be encoded in the beam of light based on the on and off periods of the light beam, as measured at one or more of the optical paths at the output of the thyristor. In one embodiment, the binary information can be encoded using on-off keying. For example, a zero or one can be encoded by redirecting the beam for substantially the entire period corresponding to a bit, and a one or zero can be encoded by not redirecting the beam for a similar period of time.

Other types of amplitude modulation can also be accomplished, as can be appreciated. For example, varying the voltage to intermediate levels can enable amplitude modulation by causing a portion of the light to be redirected. Varying the voltage can enable amplitude modulation by causing a portion of the light to be redirected. Alternatively, pulse-width modulation may be accomplished by varying the amount of time that the light beam is directed at one of the outputs. Other types of modulation are also possible, as can be appreciated.

A fast injection optical switch can be constructed using a thyristor including a switching layer and an outer doped layer. The thyristor can be biased to induce carriers to flow from the outer doped layer to the switching layer. The outer doped layer and switching layer are separated by a layer of the opposite conductivity type. The switching layer is additionally separated from the anode electrode 112 by a layer of the opposite conductivity type.

The structure of the thyristor can allow carriers to be quickly injected so that the index of refraction of the switching layer can be rapidly switched from a state in which the light beam is directed through a PN junction between the switching layer and the adjacent layer to a state in which the light beam is reflected from the PN junction. This allows the light beam to be rapidly switched or modulated. The thyristor structure can be formed using inexpensive materials such as silicon or germanium. Thus, the thyristor provides a simple, inexpensive device for rapidly switching or modulating a light beam. The simple, inexpensive device can be easily manufactured to enable data to be communicated between devices at substantially greater speeds, allowing data transmission rates to keep up with the large amounts of data now stored on consumer devices.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention.

Accordingly, it is not intended that the invention be limited, except as by the claims set forth below.

What is claimed is:

1. A fast injection optical switch, comprising:
   a thyristor including a plurality of semiconducting layers having alternating positive and negative conductivity types, wherein the plurality of semiconducting layers includes a outer doped layer and a switching layer;
   an area of the thyristor configured to receive a light beam to be directed through at least one of the plurality of semiconducting layers and exit the thyristor at a predetermined angle; and
   at least two electrodes coupled to the thyristor and configured to enable a voltage to be applied to facilitate carriers from the outer doped layer to be directed to the switching layer, wherein sufficient carriers are directed to the switching layer to provide a change in refractive index of the switching layer to redirect at least a portion of the light beam to exit the thyristor at a deflection angle different than the predetermined angle.

2. An optical switch as in claim 1, further comprising an extraction electrode coupled to the switching layer and biased to enable excess carriers to be rapidly removed from the switching layer.

3. An optical switch as in claim 1, further comprising an extraction electrode coupled to the switching layer and biased to enable carriers to be injected into the switching layer.

4. An optical switch as in claim 1, further comprising an input optical waveguide coupled to the thyristor and configured to carry the light beam to be directed through at least one of the plurality of semiconductor layers of the thyristor.

5. An optical switch as in claim 1, further comprising a first output optical waveguide coupled to the thyristor and configured to carry the light beam at one of the predetermined angle and the deflection angle.

6. An optical switch as in claim 5, further comprising a second output optical waveguide coupled to the thyristor and configured to carry the light beam at one of the predetermined angle and the deflection angle.

7. An optical switch as in claim 1, wherein the outer doped layer and the switching layer are comprised of a material having a negative conductivity type.

8. An optical switch as in claim 1, wherein the carriers are electrons.

9. An optical switch as in claim 1, wherein the outer doped layer and the switching layer are comprised of a material having a positive conductivity type.

10. An optical switch as in claim 1, wherein the carriers are holes.

11. An optical switch as in claim 1, wherein the outer doped layer and the switching layer are separated by a layer of a different conductivity type.

12. An optical switch as in claim 1, further comprising a waveguide coupled to at least one layer of the plurality of semiconducting layers, wherein the waveguide is configured to have a substantially similar index of refraction as the at least one layer.

13. An optical switch as in claim 1, wherein the thyristor is configured to be biased at a selected rate to modulate the light beam that exits the thyristor at one of the deflection angle and the predetermined angle.

14. An optical switch as in claim 1, wherein the thyristor is configured to be biased at a selected rate to switch the light beam that exits the thyristor at one of the deflection angle and the predetermined angle.

15. A method of making a fast injection optical switch for redirecting an optical beam, comprising:

forming a thyristor having a plurality of semiconducting layers including alternating positive and negative conductivity types, wherein the plurality of semiconducting layers includes an outer doped layer and a switching layer;

configuring an area of the thyristor to receive a light beam to be directed through at least one of the plurality of semiconducting layers and exit the thyristor at a predetermined angle; and connecting at least two electrodes to the thyristor to enable a voltage to be applied to enable carriers from the outer doped layer to be directed to the switching layer, wherein sufficient carriers are directed to the switching layer to provide a change in refractive index of the switching layer to redirect at least a portion of the light beam to exit the thyristor at a deflection angle different than the predetermined angle.

16. A method as in claim 15, further comprising coupling an extraction electrode to the switching layer to enable excess carriers to be rapidly removed from the switching layer.

17. A method as in claim 15, further comprising coupling the thyristor to an input optical waveguide to transmit the light beam through the at least one of the plurality of semiconducting layers.

18. A method as in claim 15, further comprising coupling the thyristor to a first output optical waveguide and a second output optical waveguide to receive the light beam from the thyristor at one of the deflection angle and the predetermined angle.

* * * * *